(12) United States Patent
Volodin

(10) Patent No.: US 8,755,421 B2
(45) Date of Patent: *Jun. 17, 2014

(54) HIGH-POWER, PHASE-LOCKED, LASER ARRAYS

(71) Applicant: PD-LD, Inc., Pennington, NJ (US)

(72) Inventor: Boris Leonidovich Volodin, West Windsor, NJ (US)

(73) Assignee: PD-LD, Inc., Pennington, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/682,849

(22) Filed: Nov. 21, 2012

(65) Prior Publication Data

US 2013/0077645 A1    Mar. 28, 2013

Related U.S. Application Data

(63) Continuation of application No. 13/113,976, filed on May 23, 2011, now Pat. No. 8,340,150, which is a continuation of application No. 11/346,667, filed on Feb. 3, 2006, now Pat. No. 7,949,030.

(60) Provisional application No. 60/649,489, filed on Feb. 3, 2005.

(51) Int. Cl.
    *H01S 5/00*    (2006.01)
(52) U.S. Cl.
    USPC ............ 372/50.123; 372/29.014; 372/29.016; 372/29.023; 372/50.11; 372/50.12; 372/99; 372/102; 359/27; 359/337.21; 359/349; 359/583
(58) Field of Classification Search
    USPC .............. 372/29.014, 29.016, 29.023, 50.11, 372/50.12, 50.123, 99, 102; 359/27, 359/337.21, 349, 583
    See application file for complete search history.

(56) References Cited

U.S. PATENT DOCUMENTS 3,145,252 A    8/1964 Herriott
3,396,343 A    8/1968 Adolf
    (Continued)

FOREIGN PATENT DOCUMENTS

EP    0310438 A1    4/1989
EP    0322218 A2    6/1989
    (Continued)

OTHER PUBLICATIONS

Advanced Dicing Technologies, "Dicing Solutions for DWDM optical filter applications", advertising brochure of ADT, Stockholm, Sweden, 2003, 2 pages.

(Continued)

*Primary Examiner* — Yuanda Zhang
(74) *Attorney, Agent, or Firm* — Condo Roccia Koptiw LLP

(57) ABSTRACT

High-power, phased-locked, laser arrays as disclosed herein utilize a system of optical elements that may be external to the laser oscillator array. Such an external optical system may achieve mutually coherent operation of all the emitters in a laser array, and coherent combination of the output of all the lasers in the array into a single beam. Such an "external gain harness" system may include: an optical lens/mirror system that mixes the output of all the emitters in the array; a holographic optical element that combines the output of all the lasers in the array, and an output coupler that selects a single path for the combined output and also selects a common operating frequency for all the coupled gain regions.

10 Claims, 9 Drawing Sheets

(56) References Cited

U.S. PATENT DOCUMENTS

| | | | |
|---|---|---|---|
| 3,580,657 A | 5/1971 | Sheridon |
| 3,603,690 A | 9/1971 | Hard |
| 3,647,289 A | 3/1972 | Weber |
| 3,936,143 A | 2/1976 | Sato |
| 4,017,318 A | 4/1977 | Pierson et al. |
| 4,057,408 A | 11/1977 | Pierson et al. |
| 4,095,875 A | 6/1978 | Lee et al. |
| 4,215,937 A | 8/1980 | Borsuk |
| 4,239,333 A | 12/1980 | Dakss et al. |
| 4,398,797 A | 8/1983 | Wedertz et al. |
| 4,514,053 A | 4/1985 | Borrelli et al. |
| 4,649,351 A | 3/1987 | Veldkamp et al. |
| 4,747,657 A | 5/1988 | Chaoui et al. |
| 4,826,270 A | 5/1989 | Opheij et al. |
| 4,901,330 A | 2/1990 | Wolfram et al. |
| 4,942,102 A | 7/1990 | Keys et al. |
| 4,943,126 A | 7/1990 | Lang et al. |
| 5,115,338 A | 5/1992 | DiGiovanni et al. |
| 5,335,098 A | 8/1994 | Leyva et al. |
| 5,440,669 A | 8/1995 | Rakuljic et al. |
| 5,452,124 A | 9/1995 | Baker |
| 5,491,570 A | 2/1996 | Rakuljic et al. |
| 5,521,748 A | 5/1996 | Sarraf |
| 5,548,676 A | 8/1996 | Savage, Jr. |
| 5,592,333 A | 1/1997 | Lewis |
| 5,619,245 A | 4/1997 | Kessler et al. |
| 5,619,609 A | 4/1997 | Pan et al. |
| 5,655,040 A | 8/1997 | Chesnoy et al. |
| 5,684,611 A | 11/1997 | Rakuljic et al. |
| 5,691,989 A | 11/1997 | Rakuljic et al. |
| 5,777,763 A | 7/1998 | Tomlinson, III |
| 5,787,107 A | 7/1998 | Leger et al. |
| 5,796,096 A | 8/1998 | Rakuljic et al. |
| 5,798,859 A | 8/1998 | Colbourne et al. |
| 5,802,092 A | 9/1998 | Endriz |
| 5,812,258 A | 9/1998 | Pierson |
| 5,825,792 A | 10/1998 | Villeneuve et al. |
| 6,055,250 A | 4/2000 | Doerr et al. |
| 6,064,685 A | 5/2000 | Bissessur et al. |
| 6,093,927 A | 7/2000 | Wickham |
| 6,122,043 A | 9/2000 | Barley |
| 6,184,987 B1 | 2/2001 | Jang et al. |
| 6,198,759 B1 | 3/2001 | Broderick et al. |
| 6,249,624 B1 | 6/2001 | Putnam et al. |
| 6,269,203 B1 | 7/2001 | Davies et al. |
| 6,285,219 B1 | 9/2001 | Pauls |
| 6,285,813 B1 | 9/2001 | Schultz et al. |
| 6,385,219 B1 | 5/2002 | Sonoda |
| 6,414,973 B1 | 7/2002 | Hwu et al. |
| 6,434,175 B1 | 8/2002 | Zah |
| 6,462,883 B1 | 10/2002 | Wang et al. |
| 6,470,120 B2 | 10/2002 | Green et al. |
| 6,524,913 B1 | 2/2003 | Lin et al. |
| 6,529,675 B1 | 3/2003 | Hayden et al. |
| 6,580,850 B1 | 6/2003 | Kazarinov et al. |
| 6,586,141 B1 | 7/2003 | Efimov et al. |
| 6,594,090 B2 | 7/2003 | Kruschwitz et al. |
| 6,673,493 B2 | 1/2004 | Gan et al. |
| 6,673,497 B2 | 1/2004 | Efimov et al. |
| 6,829,067 B2 | 12/2004 | Psaltis et al. |
| 6,876,475 B1 | 4/2005 | Trisnadi et al. |
| 6,950,454 B2 | 9/2005 | Kruschwitz et al. |
| 7,016,393 B2 | 3/2006 | Anikitchev et al. |
| 7,031,573 B2 | 4/2006 | Volodin et al. |
| 7,125,632 B2 | 10/2006 | Volodin et al. |
| 7,184,616 B2 | 2/2007 | Mead et al. |
| 7,248,617 B2 | 7/2007 | Volodin et al. |
| 7,298,771 B2 | 11/2007 | Volodin et al. |
| 7,324,286 B1 | 1/2008 | Glebov et al. |
| 7,326,500 B1 | 2/2008 | Glebov et al. |
| 8,340,150 B2 * | 12/2012 | Volodin ............... 372/50.123 |
| 2001/0016099 A1 | 8/2001 | Shin et al. |
| 2001/0028483 A1 | 10/2001 | Buse |
| 2002/0012377 A1 | 1/2002 | Suganuma et al. |
| 2002/0045104 A1 | 4/2002 | Efimov et al. |
| 2002/0176126 A1 | 11/2002 | Psaltis et al. |
| 2002/0192849 A1 | 12/2002 | Bullington et al. |
| 2003/0174749 A1 | 9/2003 | Capasso et al. |
| 2003/0214700 A1 | 11/2003 | Sidorin et al. |
| 2003/0219205 A1 | 11/2003 | Volodin et al. |
| 2005/0018740 A1 | 1/2005 | Hamilton et al. |
| 2005/0018743 A1 | 1/2005 | Volodin et al. |
| 2005/0063435 A1 | 3/2005 | Imai et al. |
| 2005/0207466 A1 | 9/2005 | Glebov et al. |
| 2005/0265416 A1 | 12/2005 | Zucker et al. |
| 2006/0029120 A1 | 2/2006 | Mooradian et al. |
| 2006/0109876 A1 | 5/2006 | Donoghue et al. |
| 2006/0123344 A1 | 6/2006 | Volkov et al. |
| 2006/0156241 A1 | 7/2006 | Psaltis et al. |
| 2006/0256827 A1 | 11/2006 | Volodin et al. |

FOREIGN PATENT DOCUMENTS

| | | |
|---|---|---|
| JP | 04-287001 | 10/1992 |
| RU | 178429 A1 | 11/1990 |
| WO | WO 03/036766 A2 | 5/2003 |

OTHER PUBLICATIONS

Sayano et al., "High Resolution Holographic Image and Data Storage System", Apr. 15, 1997.

Borgman et al., "Photothermal refractive effect in silicate glasses", Sov. Phys. Dokl., Nov. 1989, 1011-1013.

Borrelli et al., "Photosensitive glasses and glass-ceramics", Glass Processing, 439-444.

Breer et al., "Low-crosstalk WDM by bragg diffraction from thermally fixed reflection holograms in lithium niobate", Electronics Letts., 1998, 34(25), 2419-2421.

Chang-Hasnain, "High power with high efficiency in a narrow single-lobed beam from a diode laser array in an external cavity", Appl. Phys. Lett., 1987, 50(21), 1465-1467.

Churin et al., "Design of free-space WDM router based on holographic concave grating", IEEE Photonics Techn. Letts., Feb. 1999, 11(2), 221-223.

Datta et al., "Modeling of nonideal volume Bragg reflection gratings in photosensitive glass using a perturbed transmission matrix approach", IEEE Journal of Quantum Electronics, 2004, 40(5), 580-590.

Dmitriyev et al., "Volume holograms in the optical devices of optical-fiber data transmission systems, a review", Telecommun. & Radio Eng., 1995, 49(12), 9-15.

Efimov et al., "Diffractive Optical Elements in Photosensitive Inorganic Glasses", Proceedings of the SPIE Inorganic Materials III, Aug. 2, 2001, 4452, 39-47.

Efimov et al., "High-efficiency bragg gratings in photothermorefractive glass", Applied Optics, Feb. 1, 1999, 38(4), 619-627.

Glebov et al., "High-efficiency volume hologram recording in silicate glass", School of Optics and CREOL, University of Central Florida, Orlando, FL, 16 pages.

Glebov, L., "Photosensitive glass for phase hologram recording", Glass Science and Technology, 1998, 71C, 85-90.

Glebov et al., "Polychromic glasses—a new material for recording volume phase holograms", Sov. Phys. Dokl., Oct. 1990, 35(10), 878-880.

Goodman et al., "Introduction to fourier optics", McGraw-Hill Co., Inc., 2nd Ed., 1996, 329-330.

Harrison et al., "Coherent Summation of Injection-Locked, Diode-Pumped Nd:YAG Ring Lasers", Optics Letters, Feb. 1998, 13(2), 111-113.

Hendow, S., "Crystal bragg gratings stabilize laser sources", Laser Focus World, Nov. 1996, S19-S24.

In the United States District Court for the District of New Jersey, PD-LD, INC., Ondax, Inc., Case No:. 08-cv-03494, Answer to Complaint: Affirmative Defenses; Counterclaims and Jury Demand, Aug. 13, 2008, 31 pages.

Jannson et al., "Lippmann-Bragg Broadband Holographic Mirrors", Journal of the Optical Soc. Of Am., 1991, 8(1), 201-211.

Kogelnik et al., "Coupled wave theory for thick hologram gratings", The Bell System Technical Journal, Nov. 1969, 48(9), 2909-2947.

(56) References Cited

OTHER PUBLICATIONS

Kozlov et al., "All-Fiber Coherent Beam Combining of Fiber Lasers", Optic Letters, Dec. 15, 1999, 24(24), 1814-1816.
Leger et al., "Coherent Beam Addition of GaAiAs Lasers by Binary Phase Gratings", Appl. Phys. Lett., Apr. 1986, 48(14), 888-890.
Leger et al., "Coherent Laser Addition Using Binary Phase Gratings", Applied Optics, 1987, 26(20), 4391-4399.
Liu et al., "Modeling and design of planar slanted volume holographic gratings for wavelength-division-multiplexing applications", Applied Optics, Dec. 1, 1999, 6981-6986.
Loiseaux et al., "Characterization ofPerpindicular Chirped Phase Volume Grating Pairs for Laser Stretching", Optic Letters, 1996, 21(11), 806-808.
Menard et al., "Highly Efficient Phase Locking and Extracavity Coherent Combination of Two Diode-Pumped Nd: YAG Laser Beams", Optics Letters, Dec. 15, 1996, 21(24), 1996-1998.
Mills et al., "Single-Mode Operation of 1.55 Ilm Semiconductor Lasers Using a Volume holographic Grating", Electronic Letters, Jul. 1985, 21(15), 648-649.
Moser et al., "Volume Bragg grating devices", Optical Fiber Communications Conference, 2003, vol. 2, 644-645.
Moslehi et al., "Fiber-optic wavelength-division multiplexing and demultiplexing using volume holographic gratings", Optics Letters, Oct. 1, 1989, 1088-1090.
Optics Report, "Photonic Crystal may make all-optical lightwave networks possible", http://www.opticsreport.com/contentlarticle.php?articleJd=1008&page=2.
In the United States District Court for the District ofNew Jersey, PD-LD, INC, Case No:. 08-cv-03494, Initial Disclosures of Defendant Ondax, Inc. Pursuant to FRCP 26(a)(1), Sep. 12, 2008, 10 pages.
,In the United States District Court for the District ofNew Jersey, PD-LD, INC., Case No:. 08-cv-03494, Third Party Complaint by Defendant Ondax, Inc. Against Arasor International Limited and Jury Demand, Aug. 22, 2008, 9 pages.
Phase conjugate mirror and diffraction grating yield stable, collimated, coherent, high-power diode laser, J.acques, Oregon, Medical Laser Center Newsletter, Dec. 1997.
Qiao et al., "Dispersion-enhanced volume hologram for dense wavelength division Demultiplexer", IEEE Photonics Technology Letts., Aug. 2000, 12(8), 1070-1072.
Rakuljic et al., "Volume holographic narrow-band optical filter", Optical Engineering, Oct. 1997, 36(10), 459-461.
Remy, "Lehrbuch der Anorganishen Chemic Band", 1960, 1 page.
Rendow et al., "Crystal bragg gratings stabilize laser sources", Laser Focus World, Nov. 1996, S19-524.
Sakamoto et al., "20 W CW monolithic AlGaAs (810nm) laser diode arrays", Electronic Letts., 1992, 28(2), 178-180.
Sayano et al., "ModularWDM add/drop multiplexers," SPIE, 1997, 3234, 102-107.
Sayano et al., "Holographic grating filters in optical glasses for C31 WDM networks", Accuwave Corp., sponsored by Ballistic Missile Defense Organization, AFRL-SN-RS-TR-1998-81, Final Technical Report, May 1998, 1-35, DL-1-DL-3.
Scholes, "S. R. Modem Glass Practice", 1975, pp. 217.
Shelby, J.E "Introduction to Glass Science and Technology", Royal Society of Chemistry, 1997, 43.
Spectrogon, "Optical Interference Filters, 17th Ed., Taby, Sweden", www.spectrogen.com, 3-21.
Timofeev et al., "Free-space grating multi/demultiplexer and wavelength-router for densely spaced WDM networks",WDM Technology and Applications (Digest No. 1997/036), IEE Colloquium, 1997, Nov. 1-Nov. 5.
Veldkamp et al., "Coherent Summation of Laser Beams Using Binary Phase Gratings", Optics Letters, May 1986, 11(5), 303-306.
Victor Leyva and George Rakuljic, "Method for Writing Reflection Mode Gratings in Photorefractive Materials in the Infrared", Applicant calls to the Office's Attention, Application No:. 820/CAL93, Filed Dec. 28, 1993.
Volodin, B., et al., "High-resolution compact imaging holographic Bragg grating spectrometer", CLEO, 1998, 401-402.
Yiou, S., et al., "Improvement ofthe spatial beam quality oflaser sources with an intracavity Bragg grating", Optics Letts., 2003, 28(4), 242-244.
Zhao et al., "Subpicometer accuracy laser wavelength sensor using multiplexed bragg gratings", IEEE Photonics Technology Letts., Nov. 1997, 9(11), 1493-1495.
Zhao et al., "Reliable grating-based wavelength division (de)multiplexers for optical networks", Opt. Eng., Jul. 2001, 40(7), 1204-1211.
Zhao et al., "Ultraviolet Ca K-line narrow-bandwidth imaging filters based on holographic Bragg gratings in photorefractive materials", Opt. Eng., Oct. 1997, 36(10), 2918-2921.

* cited by examiner

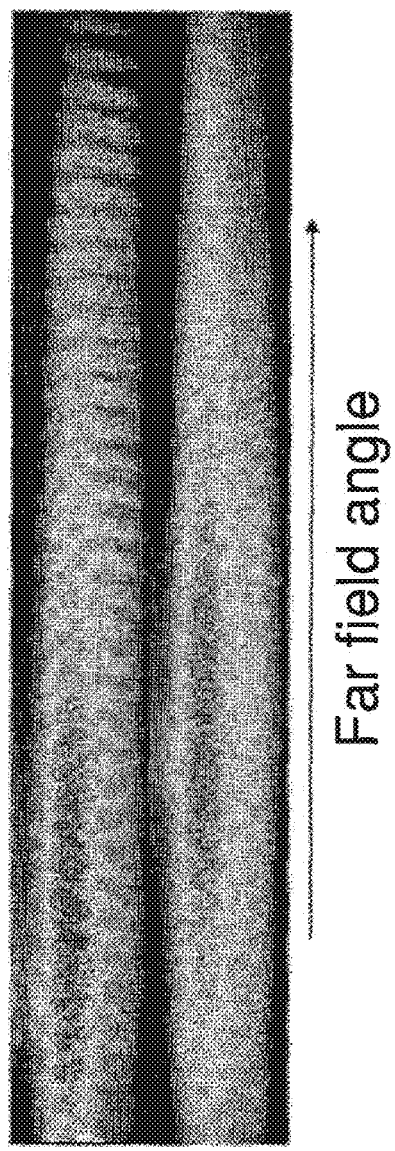

HIGH-POWER, PHASE-LOCKED, LASER ARRAYS

CROSS-REFERENCE TO RELATED APPLICATIONS

This application is a continuation of U.S. patent application Ser. No. 13/113,976, filed May 23, 2011, which is a continuation of U.S. patent application Ser. No. 11/346,667, filed Feb. 3, 2006, now U.S. Pat. No. 7,949,030, which claims benefit under 35 U.S.C. §119(e) of provisional U.S. patent application Ser. No. 60/649,489, filed Feb. 3, 2005, the contents of each of which are incorporated herein by reference.

BACKGROUND

Lasers are the brightest and, in many instances, some of the most efficient sources of light available today. Nevertheless, there is a constant need to increase their brightness and total power even further. There are, however, real barriers to increasing the brightness of a single laser source of any design that currently present some of the most difficult technological challenges. One of the best examples is semiconductor lasers. Semiconductor lasers provide the highest electrical-to-optical power-conversion efficiency, and achieve very high optical gain, but typically do not provide sufficiently high contiguous gain volume. As a result, optical power in excess of 10 W (i.e., continuous wave) can currently be extracted only from arrays of semiconductor laser diodes. Such ensembles of individual laser emitters, however, cannot readily provide a diffraction-limited or nearly diffraction-limited beam, even though they can deliver very impressive total output power (e.g., ~500 W/cm2 of array face area currently achieved). This results in poor brightness of otherwise highly efficient and powerful light sources.

The poor mode quality of laser diode arrays stems from the fact that the gain is extracted from physically separate pump regions, essentially making them extended area light sources. However, if there was a technique to harness the gain of such separate gain regions and make them behave as parts of a contiguous gain medium with a constant phase difference between all the regions, then the light emitted by all such regions would be coherent and, as a result, could be efficiently combined into a single beam of much higher optical quality than that of the standard laser diode array. This problem is common to all laser types and, if solved, would allow for harnessing together the power of multiple laser sources with progressively increasing brightness, without having to deal with the problems of scaling up the power of each individual source.

Other methods of beam combination for increased brightness include polarization combining and spectral beam combining. Polarization beam combining, however, can only increase brightness by a factor of two. Spectral beam combining, on the other hand, does not increase spectral brightness.

SUMMARY

The approach disclosed herein utilizes a system of optical elements that may be external to the laser oscillator array. Such an external optical system may achieve: a) mutually coherent operation of all the emitters in a laser array; and b) coherent combination of the output of all the lasers in the array into a single beam.

An example embodiment of such an "external gain harness" system may include: 1) an optical lens/mirror system that mixes the output of all the emitters in the array in one region in space; 2) a beam combining element (BCE), positioned in the region of space that combines the output of all the lasers in the array; and 3) an output coupler, positioned after the BCE, that selects a single path for the combined output and also selects the common operating frequency for all the coupled gain regions.

The optical mixing system may be a single lens. It should be understood, however, that the optical mixing system may include any combination of one or more lenses, mirrors, and/or prisms. A BCE may be reflective or transmissive, and may be manufactured using three-dimensional, holographic Bragg grating technology, such as VBG™, which is developed, manufactured, and distributed by PD-LD, Inc. It should be understood that a BCE may be manufactured using other techniques. For example, the BCE may be a holographic optical element, a diffractive optical element, such as a Dammann grating or a spot array generator, or any other optical element with suitable functionality. The output coupler may be constructed from a reflective or transmissive Bragg grating element that provides wavelength-selective feedback for a single optical path of the BCE that forces coherent operation of all the emitters with a specific phase difference that will achieve constructive interference in that particular optical path. Other possible options include a phase-conjugate mirror used in combination with one or more optical etalons or other wavelength-selective elements.

A principle of operation of such a "gain harness laser (GHL)" is in mixing the output of all the individual emitters in the array, filtering the mixed output based on the relative phase of the light emitted by each of the separate gain regions, then further filtering the light based on wavelength in order to limit the number of longitudinal modes oscillating in the composite resonator. The mixed and filtered output is then fed back into the separate gain regions, each of the regions thus receiving seed light from all the others with appropriate wavelength and phase. When the returned light is filtered in the way described, the feedback from all the gain sections adds constructively at the front emitting aperture of each of the gain regions and, therefore, creates a relatively strong feedback capable of locking the laser array into coherent operation.

The approach described herein may achieve long range coupling between the members of a laser oscillator array, limiting the number of coupled modes by using wavelength-selective feedback from a Bragg grating element, and also limiting the coupling to a particular phase state of the emitter array by use of a BCE and an optical path selector.

The GHL concept is, in principle, rather similar to the injection seeding of a high-power slave laser with a lower-power master laser. However, unlike in the case of master/slave configuration, there is no need for active phase control of the seed light—the phase adjustment happens automatically due to the effect of the gain harness. Furthermore, in case of GHL, there is no need to cascade the slave lasers/amplifiers into multiple stages—the seed power scales directly with the number of lasers in the array. Nonetheless, the GHL itself can be used as a powerful seed source for a large super-array of semiconductor or other type lasers in order to achieve higher-level coherence and overall power.

The GHL approach described herein may provide for self-adjusting coherence (e.g., there may be no need for active phase control). There may be no need for an external seed source. There may be no need for modifying the high-power laser resonators, which allows the use of lasers with highest possible native efficiency. The approach provides for simplicity and robustness (e.g., minimum number of optical components), and for scalability—via using the GHL as a seed source and via spectral combining. It should be understood that spectral beam combining, which does not increase spectral brightness, may be employed as a complementary technique to the coherent beam combining described herein.

To understand the functionality of the BCE, consider the propagation of the laser light in reverse. For example, if one considers a diffraction-limited beam entering the gain harness block of the GHL counter-propagating with its output, that beam will pass through the Bragg grating output coupler, with a certain percentage of it being reflected back, and reach the BCE. The BCE will produce an image matching the laser array that will be projected onto the output apertures of the lasers by the Fourier-transform lens. Note that, for a properly constructed BCE, each laser emitter may receive the same proportion of light injected into the cavity. If the light returned from the laser cavities has the same phase difference between the different paths as the incident light, all the beams of light returning to the BCE will be recombined into a single diffraction-limited beam now counter-propagating with the imaginary injected beam of light, thus closing the cavity path.

The selection of the proper phase condition for the reconstruction of the output beam is likely to occur spontaneously in the GHL cavity due to the dense mode spacing of the external gain harness relative to the spectral width of the reflectivity envelope of the output coupler. Although the use of a Bragg grating as an output coupler represents the most convenient and simple method of completing the GHL cavity, a phase-conjugate mirror (in conjunction with an output path selector, which may be a simple aperture, and a band pass filter, which may be an optical etalon, thin film filter or other) may also yield good stability of the cavity.

The performance of the device may be related to the performance of the BCE. For example, the diffraction efficiency of the BCE and the amount of light leaking into higher orders may determine the total loss of the GHL cavity. The use of holographic Bragg grating elements for fabrication of a BCE may be desirable, therefore, as they afford the possibility of fabricating a true matching filter for a particular laser array, as opposed to a phase-only filter constructed using, for example, the techniques of binary digital holography employed for fabrication of surface-etched pattern generators. It should be understood, however, that such a BCE may be fabricated via techniques other than Bragg grating technology.

The technique described herein applies to many different kinds of laser oscillators and/or gain media: semiconductor laser diodes (both optically and electrically pumped, either single transverse mode or broad-area multi-mode), solid-state lasers, fiber lasers, gas and ion lasers, atomic vapor lasers, etc. It is not restricted to strictly $TEM_{oo}$ operation of the oscillators.

There are at least two possible regimes for the operation of laser arrays with external gain harness—i.e., weak and strong coupling regimes. In the case of weak coupling, the laser array is operating above threshold near its nominal output power and pump level. The feedback from the external gain harness acts as a weak perturbation to the array, just sufficiently strong enough to cause the spontaneous transition to the coherent operation. In the case of strong coupling, however, the laser array would not nominally reach the lasing threshold but, rather, would be operating as an amplifier or an active mirror with a faceted surface. In that case, the external gain harness may complete the cavity and reduce the intracavity losses to the level sufficient for stable lasing.

The GHL concept may be, in many respects, similar to self-mode-locking of ultra-fast lasers via the formation of a Kerr lens inside the gain medium. The concept may be referred to as Kerr Lens Mode locking or KLM. Similar to GHL, KLM relies on the fact that the cavity loss becomes significantly reduced for a particular phase difference between the longitudinal modes of the laser cavity, namely that which leads to the formation of a continuous train of short pulses. In the case of GHL the particular phase difference between the different gain paths leads to the constructive interference along the path selected by the output coupler/path selector.

The GHL approach offers a clear and simple path to further power scaling due to its inherent compactness and narrow-band operation. There are two possible routes for GHL power scaling: 1) using GHL as a seed for a larger array of coherent lasers; and 2) using spectral combining of the output of individual GHLs. The first approach, although feasible, may require active phase control on the separate injection paths and, therefore, may be rather complex. The second approach, on the other hand, is a very natural choice because the output of GHL tends to be very narrow spectrally. For this reason, a large number of GHLs can be combined spectrally within a spectral region of several nanometers.

BRIEF DESCRIPTION OF THE DRAWINGS

FIGS. 6A and 6B depict the results of a test on inducing cross-element coherence of a laser diode bar.

DETAILED DESCRIPTION OF EXAMPLE EMBODIMENTS

Figure 1A:
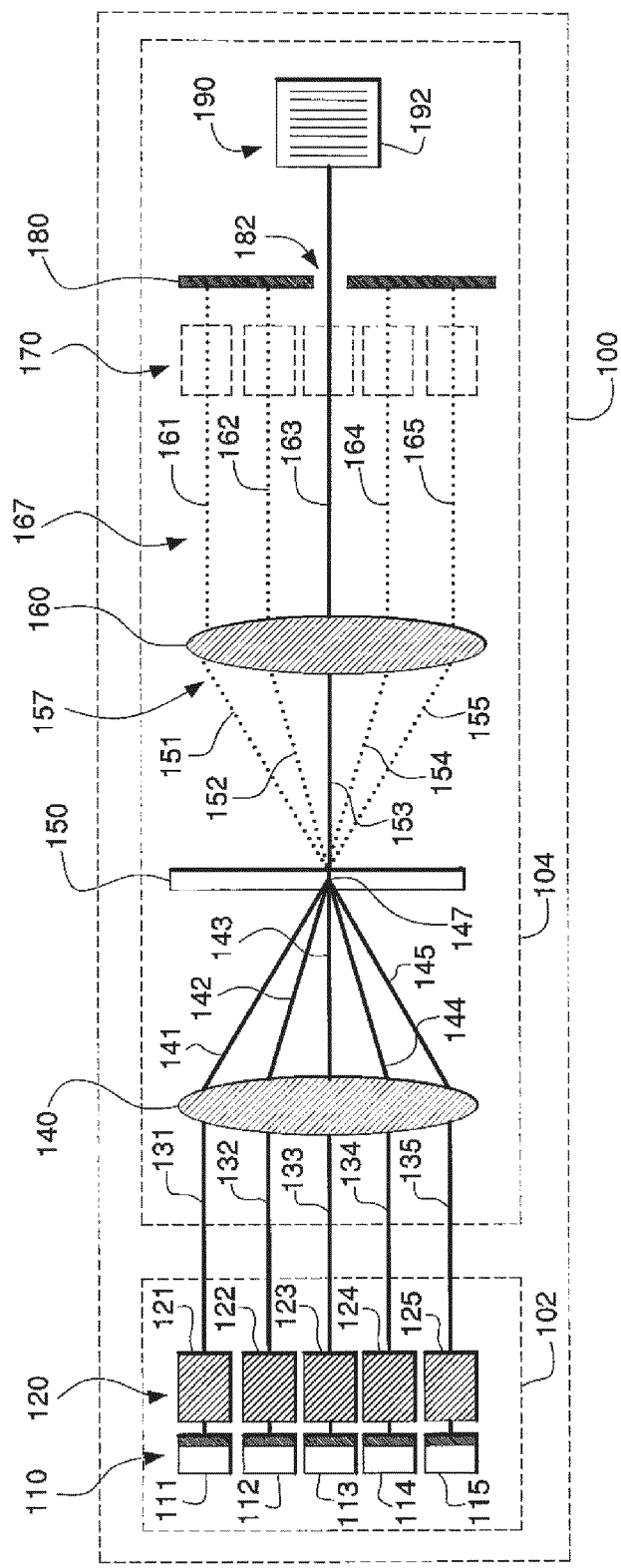
FIGS. 1A and 1B depict a cavity with multiple gain paths phase-locked by use of a beam combining element (BCE), a path selector, and different types of output couplers.
Figure 1B:
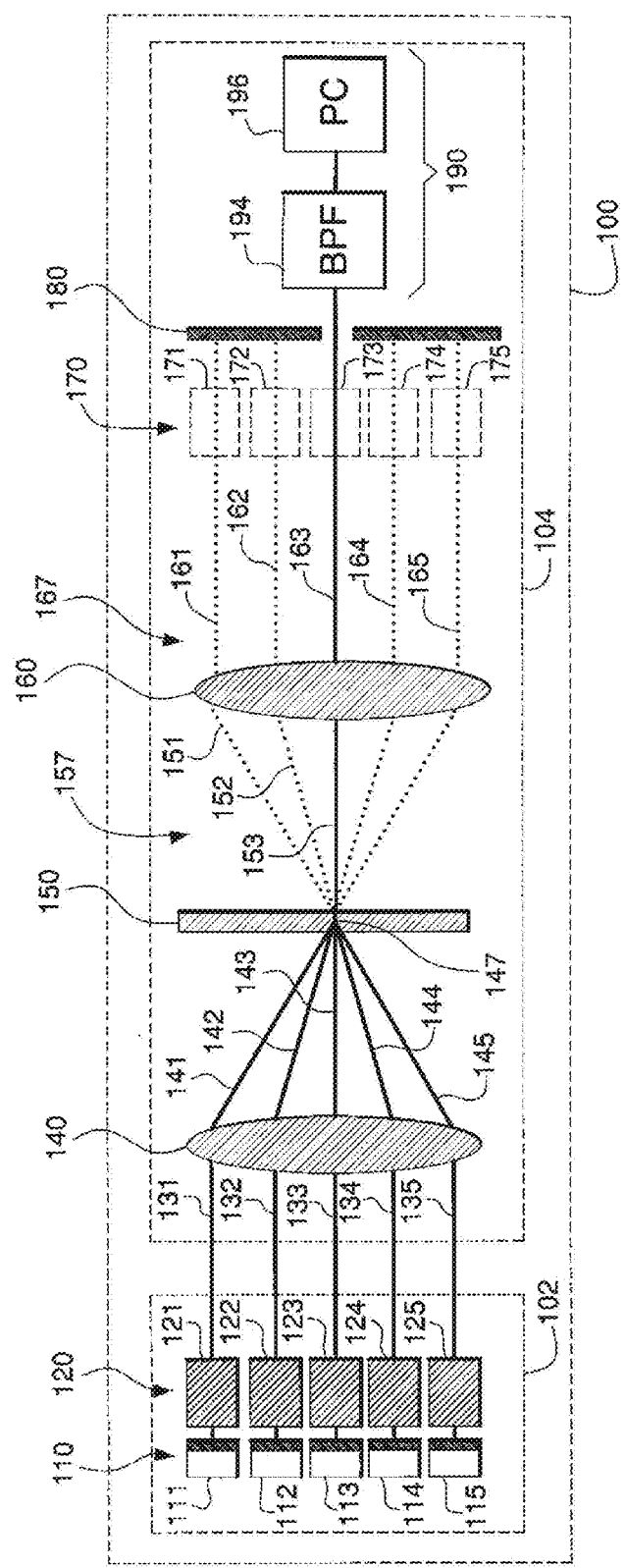

FIGS. 1A and 1B depict example embodiments of systems and methods for achieving phase synchronization of multiple gain paths of a complex laser cavity. A composite resonator 100, as shown, may include an internal part 102, which may include those components that a typical laser cavity would have, and an external part 104, which may include additional components that enable phase synchronization of multiple gain paths in the laser cavity. The internal part 102 may include an array 120 of gain section resonators 121-125. Each gain section 121-125 may emit light, such as laser light, for example, along a respective optical path 131-135.

In order to achieve the best phase-locking (i.e., coherence) between the several gain sections 121-125, it may be desirable that coupling, preferably equally-strong coupling, is achieved between each emitter 121-125 in the array 120 and every other emitter 121-125 in the array 120. In order to construct a complete laser cavity with the independent gain sections 121-125 of the array 120, a plurality 110 of highly reflective mirrors 111-115 may be disposed proximate a first end of the gain sections 121-125. The opposite ends of the gain section 121-125 may have partially reflective mirrors (not shown) or no mirrors at all (as shown).

In order to achieve coupling between the individual gain sections 121-125, it may be desirable to mix the optical paths of the light beams 131-135 emitted by the gain sections 121-

125. That is, the optical paths may be caused to overlap one another in space. As shown in FIGS. 1A and 1B, this may be accomplished by a Fourier transform (FT) lens 140 disposed to receive the light beams 131-135 emitted by the individual gain sections 121-125. The lens 140 performs an optical Fourier transform on the received beams 131-135, forming transformed beams 141-145. Each of the transformed beams 141-145 corresponds to a respective one of the emitted beams 131-135. The FT lens 140 focuses the transformed beams 141-145 onto its back focal plane. The transformed beams 141-145 are thereby mixed, in a location 147 in the back focal plane of the lens 140.

A beam combining element (BCE) 150 may be positioned in the back focal plane of the FT lens 140, and in the front focal plane of a second FT lens 160. The BCE 150 may be designed to split a single beam of light (e.g., beam 143) into a plurality of beams 151-155 in a controlled manner. The BCE may split each incident beam into the same number of beams as there are gain sections in the array 121-125. At least one of the beams 151-155 output from the BCE should be a composite of all the beams 141-145 and, therefore, representative of a composite of all the beams 131-135. The beams 151-155 are split out of the BCE in such a manner as to form a pattern 157 that corresponds to a spatial arrangement of the individual gain sections 121-125 of the system. That is, the pattern 157 represents how the emitters 121-125 are arranged relative to one another (e.g., the beams output from the BCE form an array that matches the array of beams output from the emitters).

The BCE may be designed to be made by using the techniques of three-dimensional Bragg gratings (described elsewhere), using surface diffractive optical elements, or any other suitable technique. The BCE may be made of an optical material with high transparency, high durability, and high optical damage threshold.

The second FT lens 160 performs an optical Fourier transform on the beams 151-155 received from the BCE 150, forming re-transformed beams 161-165. At least one of the re-transformed beams 161-165 is a composite of all the beams 131-135. Accordingly, after the optical Fourier transform is performed by the second FT lens 160, a pattern 167 will appear that includes an image 170 of the array 120 of individual gain sections 121-125. The images 171-175 of all the individual gain sections 121-125 will overlap at least on one of the images of the exit apertures of the individual gain sections.

A path selector 180 may be positioned after the second FT lens 160. The path selector 180 may define an aperture 182 that allows light from one of the optical paths 161-165 (e.g., optical path 164, as shown) through the path selector 180. The path selector may be made of a non-transparent material that is robust enough to withstand the exposure to light at the operating power of the system. Thus, the path selector 180 may restrict the feedback into the gain regions to come only from a path containing overlapping beams from all the gain sections in the array. Together with the BCE 150, the path selector 180 may force a particular phase state for the ensemble of phase-locked emitters that would produce constructive interference from all the emitters in the output of the system.

An output coupler 190 may be positioned behind the path selector 180. The output coupler 180 may reflect back some or all of the light propagating along the optical path 164 selected by the path selector 180, thus completing the external portion 104 of the composite cavity 100. As shown in FIG. 1A, the output coupler 190 may include a three-dimensional, Bragg grating element 192, which may be formed of a three-dimensional, transparent material (e.g. glass, crystal, polymer) having a Bragg grating recorded therein. Such a Bragg grating element may have a spectrally-narrow reflectivity band that tends to restrict the number of longitudinal modes oscillating in the composite cavity 100 and, as a result, tends to achieve stable phase locking between the individual gain sections 121-125 of the array 120.

The BCE 150 re-maps the light returned by the output coupler 190 (along the optical path 164 selected by the path selector 180) back onto the array 120 of gain sections 121-125. As an array 120 of individual gain sections 121-125 will have a fill factor of less than one (and very likely much less than one), it may be desirable that the light returned by the external part 104 of the composite cavity 100 does not fall in between the front emitting apertures of the individual gain sections 121-125. This may be accomplished by a properly-designed BCE 150 that insures minimal possible loss inside the composite cavity.

The mixed and filtered output (reflected from the Bragg grating element along optical path 164) is thus fed back into each of the gain regions 121-125. Each of the gain regions 121-125 thus receives "seed" light from all the others (because the composite beam is fed back to each) with appropriate wavelength, selected by the output coupler, and phase, selected by the BCE and the path selector. When the returned light is filtered as described above, the feedback from all the gain sections 121-125 adds constructively at the front emitting apertures of the several gain regions 121-125 and, therefore, creates a relatively strong feedback capable of locking the laser array 120 into coherent operation. Thus, the Bragg grating element provides feedback for a single optical path of the BCE that forces coherent operation of all the emitters with a specific phase difference that will achieve constructive interference in that particular optical path.

As shown in FIG. 1B, the output coupler 190 may include a bandpass filter 194 that allows a selected wavelength or band of light through to a mirror 196, which may be a phase-conjugate mirror or an ordinary mirror, for example. The mirror 196 reverses the phase of the light incident upon it. Such an output coupler may be used in conjunction with other wavelength-selective elements or band-pass filters such as, for example, optical etalons, Bragg gratings, diffraction gratings, etc.

Note that, although FIGS. 1A and 1B depict five separate gain sections 121-125 arranged in a one-dimensional array 120, it should be understood that the techniques described herein apply, without restriction, to larger-sized one-dimensional and two-dimensional arrays of emitters.

Figure 2:
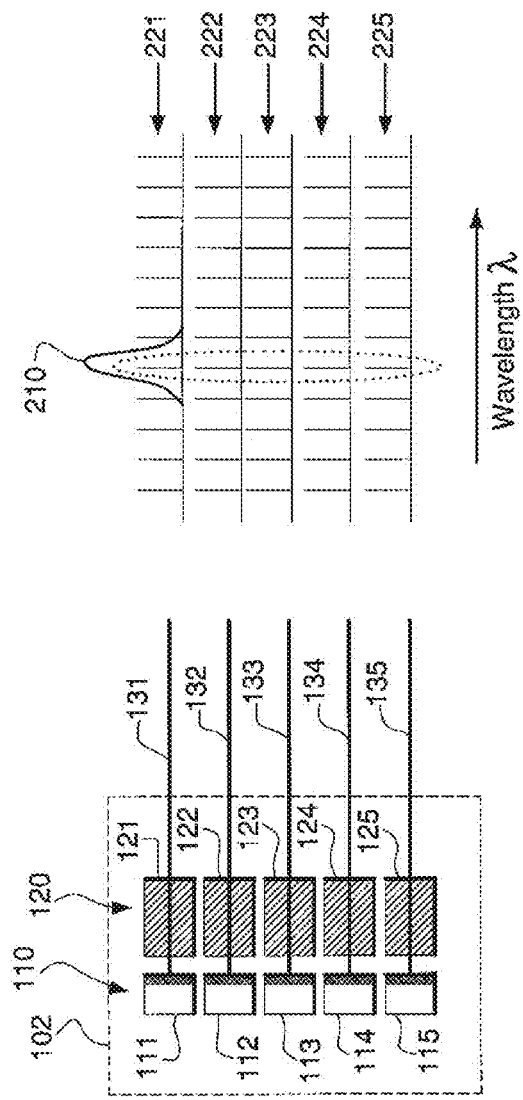
FIG. 2 illustrates the role of a wavelength-selective output coupler.

FIG. 2 illustrates the role of a wavelength-selective output coupler. The individual gain sections 121-125 of the emitter array 120 may have internal resonators formed by the highly reflective mirrors 111-115 near the respective back apertures of the gain sections 121-125 and partially reflective mirrors (not shown) near the respective front apertures of the gain sections 121-125. In general, each of the internal resonators may have a slightly different mode comb 221-225. When a wavelength-selective output coupler is used, it may restrict the number of internal resonator modes to a single mode or a few close modes, as shown by the dashed ellipse in FIG. 2, thus increasing the coherence between the light 131-135 emitted by the individual gain sections 121-125. Note that the lower the reflectivity of the partial reflector in the front part of the gain section (not shown), the wider will be the broadening of the modes within the mode comb of the internal resonators. This may facilitate better phase locking of the individual gain sections 121-125.

Figure 3A:
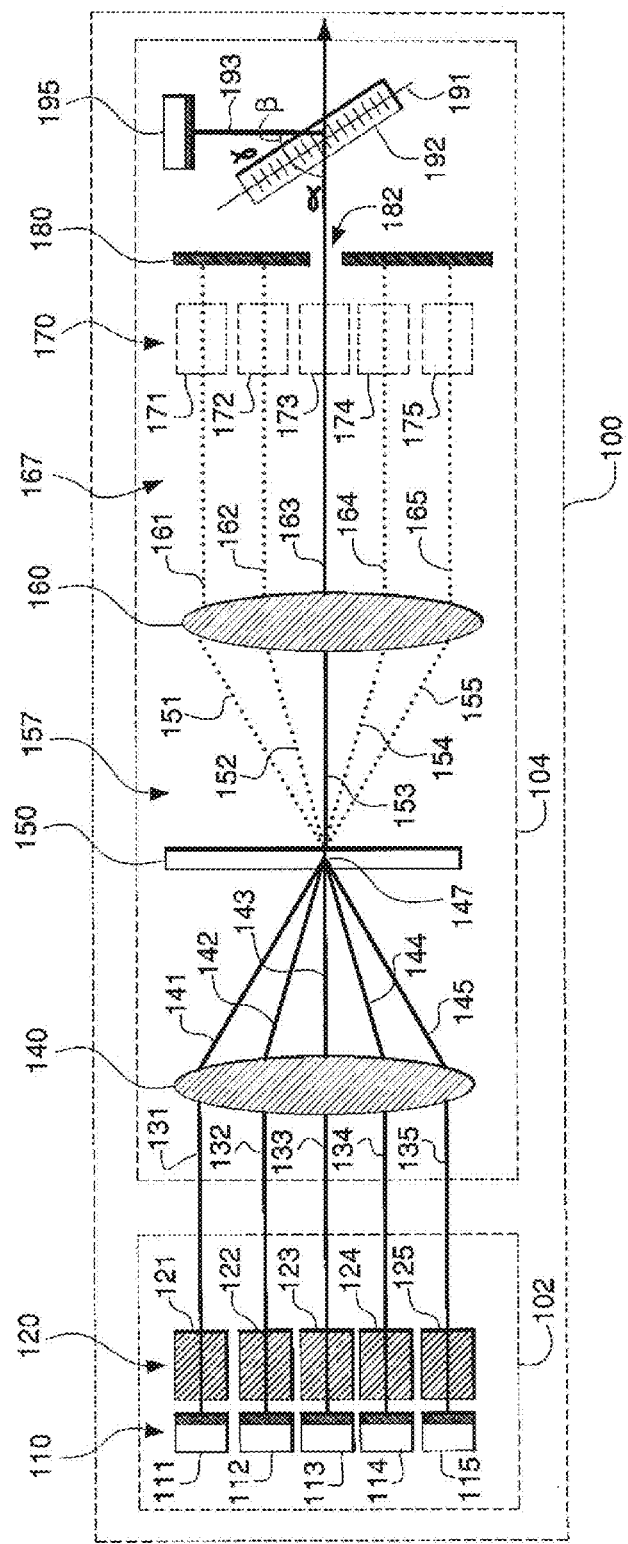
FIGS. 3A and 3B depict laser cavities with phase locking of multiple-gain paths and different types of wavelength-selective, tunable output couplers.

FIG. 3A depicts a tunable, wavelength-selective output coupler 190 using a transmissive Bragg grating element 192. If wavelength tuning is desired in an array 120 of coherent emitters 121-125, it can be accomplished via angular adjustment of the transmissive Bragg grating element 192. Adjusting the angle of incidence a of light onto a transmissive Bragg grating 194 changes the Bragg matching condition and, therefore, changes the wavelength for which maximum diffraction efficiency is achieved. Thus, the Bragg grating element 192 can provide wavelength-selective feedback for a single optical path 164 of the BCE 150 that forces coherent operation of all the emitters 121-125 with a specific phase difference that will achieve constructive interference in that particular optical path 164.

Figure 3B:
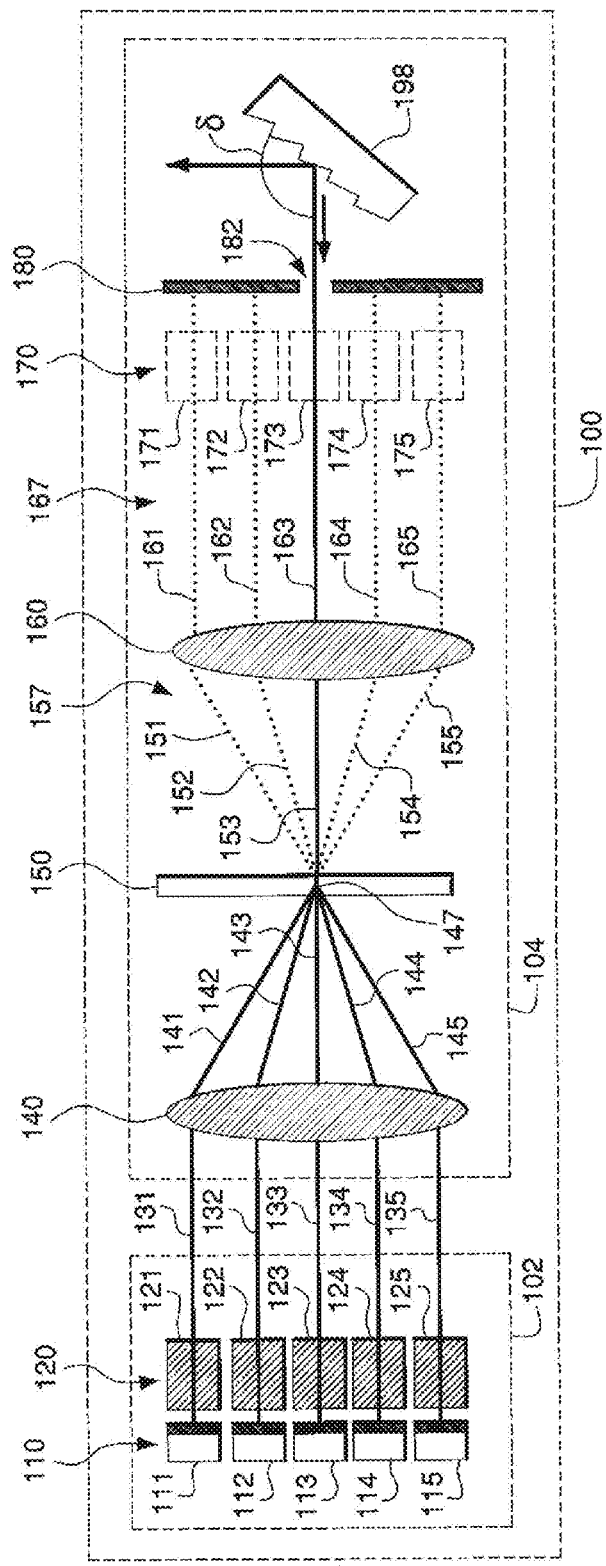

As shown in FIG. 3B, a diffraction grating 196 can be used in well-known Littrow (as shown in FIG. 3B), Littman-Metcalf, or other configurations, in order to provide wavelength-selective feedback back into the emitters.

As shown in FIGS. 3A and 3B, the light 131-135 emitted by the individual gain sections 121-125 is mixed in the back focal plane of the first FT lens 140, where a BCE 150 is positioned. The BCE 150 mixes the optical paths 141-145 of all of the gain sections 121-125. A second FT lens 160 may be used in order to produce mixed images 171-175 of the individual gain sections 121-125 in its back focal plane. A path selector 180 may be positioned in the back focal plane of the second FT lens 160. The path selector 180 selects a single common optical path 164 for all light-emitting sections. A transmissive Bragg grating element 192 diffracts the mixed light at a certain diffraction angle β according to particular design conditions. A partially or fully reflective output coupler 194 is positioned in the path of the diffracted beam 193. The output coupler 194 reflects the light incident upon it back on its path 164, thus completing the external part 104 of the composite resonator 100. Wavelength tuning is achieved by adjusting the angle α between the Bragg grating element 192 and the beam incident upon it.

Similarly, as shown in FIG. 3B, a diffraction grating 196 can be rotated, which adjusts the wavelength of the light returned onto the emitters. Thus, the diffraction grating 196 can be used as a wavelength-selective element that can achieve wavelength tuning via adjustment of the incident angle δ. The diffraction grating 196 may be reflective, as shown in FIG. 3B, or transmissive. It may be a surface diffraction grating or a volume holographic grating. The diffraction grating 196 can be manufactured by any of a number of techniques, such as, for example, surface ruling, holographic techniques, etching, etc. The wavelength-selective feedback may be produced in the $1^{st}$ or higher diffraction order of the diffraction grating, and the output of the system may be produced in the $0^{th}$ order of the diffraction grating.

Figure 4A:
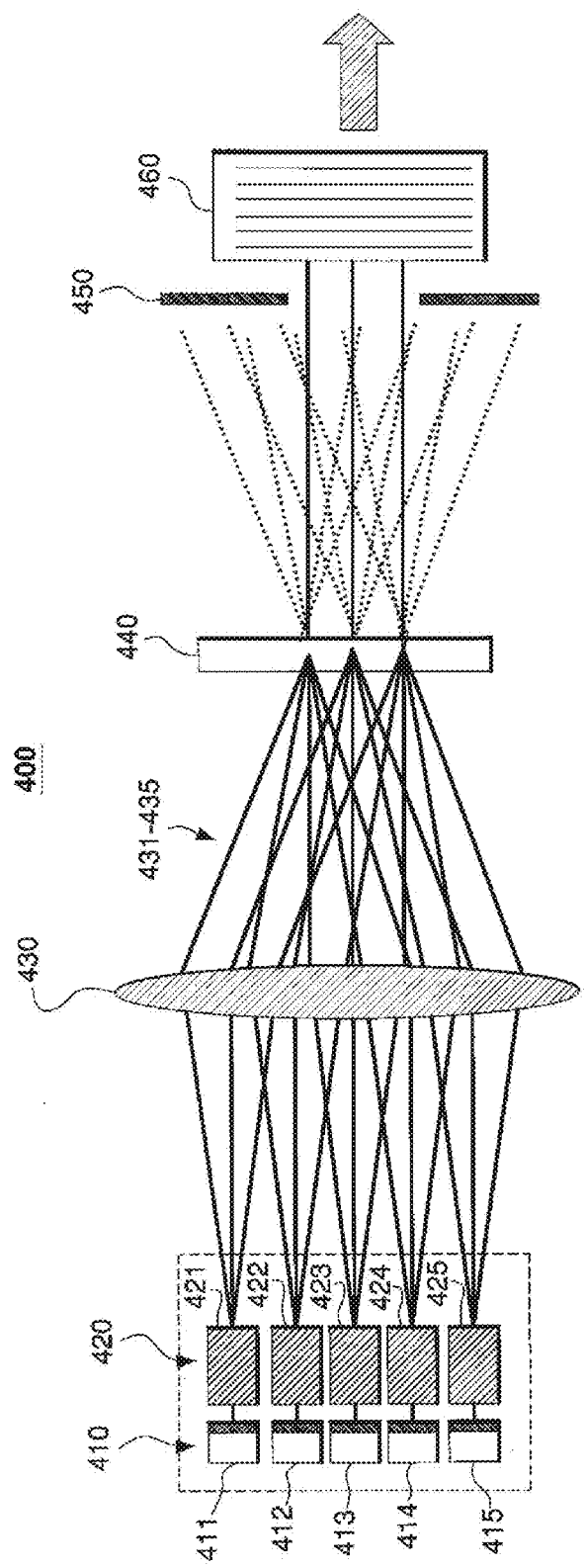
FIGS. 4A and 4B depict a gain harness laser with long-range coupling between the laser array elements.
Figure 4B:
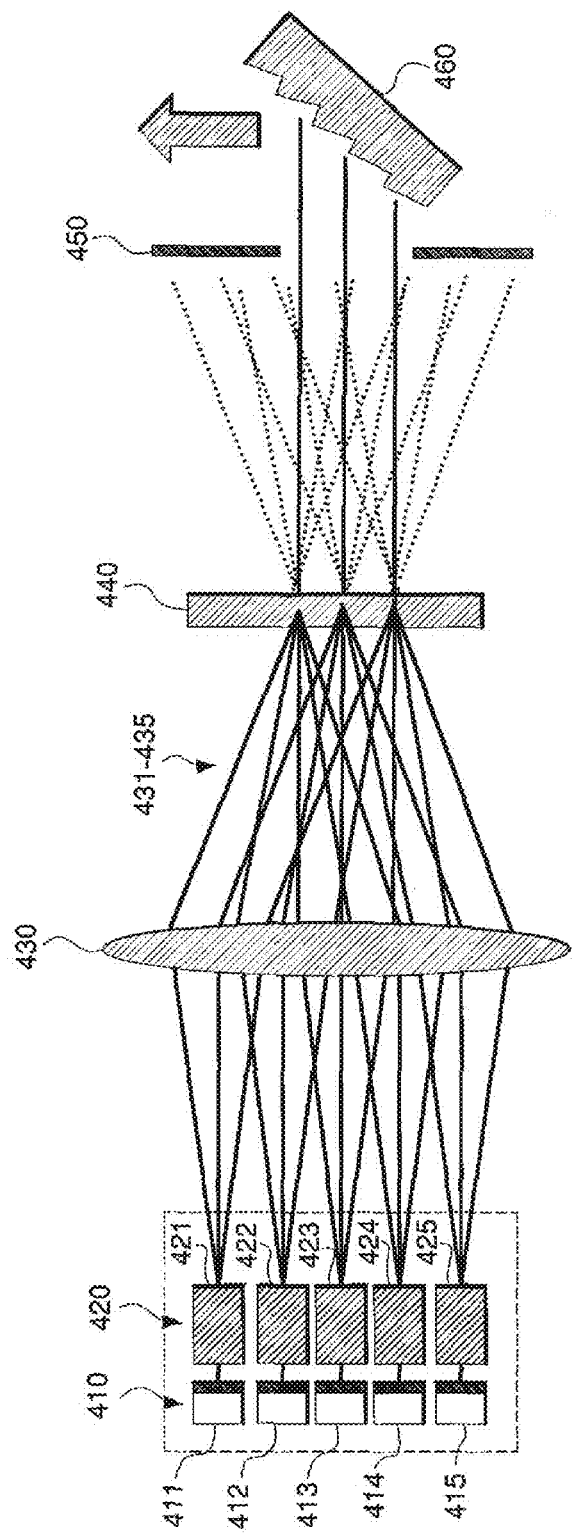

FIGS. 4A and 4B depict a gain harness laser (GHL) 400 with long-range coupling between the laser array elements 421-425. The GHL 400 may include an array 420 of individual gain sections/emitters 421-425, which may be an array 420 of laser diodes. It may also include a Fourier transform (FT) lens 430, a BCE 440, a path selector 450, and a wavelength-selecting element 460, such as a three-dimensional Bragg grating element (as shown in FIG. 4A) or a diffraction grating (as shown in FIG. 4B) as an output coupler. The FT lens 430 collimates and overlaps the outputs of the individual emitters 121-125 in a certain location in space. The BCE 440 may be positioned in that location and receives the focused optical paths 421-425. The BCE 440 mixes the focused optical paths 431-435 of all of the gain sections 421-425 into a common path. As shown in FIGS. 4A and 4B, a path selector 450 is positioned behind the BCE 440, without the use of a second FT lens (as described above). The light allowed through the path selector 450 is reflected back by a three-dimensional Bragg grating (as shown in FIG. 4A) or a diffraction grating (as shown in FIG. 4B) that serves as a wavelength-selective output coupler 460 due to its narrow reflectivity spectrum. The diffraction grating may be reflective, as shown in FIG. 4B, or transmissive. It may be a surface diffraction grating or a volume holographic grating. The diffraction grating can be manufactured by any of a number of techniques, such as, for example, surface ruling, holographic techniques, etching, etc. It may be used in any well-known arrangements, such as Littrow, Littman-Metcalf, or any other suitable configuration.

Figure 5:
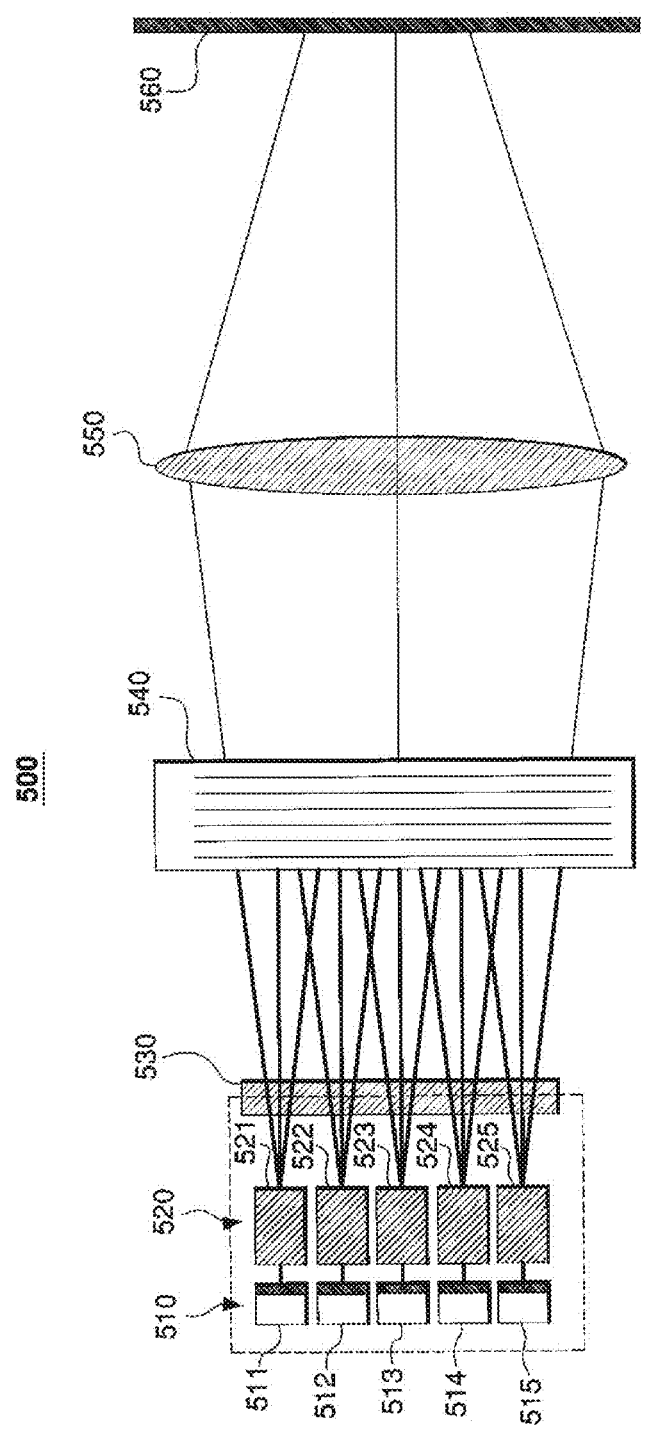
FIG. 5 provides a schematic of a test setup for inducing cross-element coherence of a laser diode bar.

FIG. 5 is a schematic diagram of a test setup 500 for inducing cross-element coherence of a laser diode bar using a Talbot cavity. As shown, the test setup 500 may include an array 520 of individual gain sections/emitters 521-525, a collimating lens 530 or lens array, and a three-dimensional Bragg grating element 540 that reflects some of the light back into the individual emitters 521-525.

An experiment was conducted using the test setup shown in FIG. 5. The Bragg grating element 540 was positioned at a particular distance from the face of the laser diode bar 520 so that, upon reflection from the Bragg grating element 540, the diffraction pattern on the face of the laser diode bar 520 would repeat or nearly repeat the arrangement of the emitters 521-525 and, therefore, maximize the coupling in the composite cavity. A Fourier-transform lens 550 was used to produce the far field pattern of the array, which was observed on a screen 560. If coherence between the emitters 521-525 in the laser diode array 520 is achieved, the far field pattern will show clear signs of coherent interference (i.e., fringes).

FIGS. 6A and 6B provide far field patterns observed during the experiment. FIG. 6A provides a far field pattern for a situation wherein the Bragg grating element 540 is aligned to reflect the incident light back on its path. FIG. 6B provides a far field pattern for a situation wherein the Bragg grating element 540 is mis-aligned and, therefore, does not reflect the incident light back on its path. The results show an apparently stable interference pattern in the far field of the laser diode array 520, which is only possible if there exists a constant and stable phase difference between the modes of the several emitters 521-525 in the array 520. If the phase difference between the individual emitters 521-525 in the array 520 is not constant, then the interference pattern loses it stability and visibility (i.e., no periodic dark fringes are observed).

It should be understood that the systems and methods described and claimed herein may be applied to, among other things: apparatus and methods using reflective and transmissive holographic Bragg grating elements as a feedback element to achieve coherence; systems using coherently combined laser arrays that use Bragg grating elements; systems that perform spectral beam combining of the coherently combined laser arrays using Bragg grating elements; coherently combined systems using Bragg grating elements as wavelength selector that are used for second harmonic generators or optical parameteric oscillators or parameteric amplification; coherent combining of laser diodes, solid-state lasers, fiber lasers, gas lasers, ion lasers, alkali vapor lasers, and the like; coherent combining of lasers with $TEM_{00}$ output; coherent combining of lasers with multi-mode output; and using phase conjugate mirrors for coherent beam combining.

The advantages of laser systems constructed according to the approaches described herein can be exploited in any application that benefits from laser sources with increased brightness and power. Such applications include, but are not limited to, laser pump sources, direct material processing, military applications (e.g., directed energy weapons, target designators, laser range finders, etc.), laser radars, optical communications, spectroscopy (including differential absorption spectroscopy, Raman spectroscopy, different other nonlinear spectroscopy techniques), medical applications (e.g., therapeutic, surgical, diagnostic, etc.), remote sensing, security applications, etc.

What is claimed:

1. A method for producing mutually-coherent operation of a plurality of light emitters, each of the emitters outputting a respective power and having a respective brightness, the method comprising:

combining respective beams received from each of the plurality of emitters to form a composite beam containing a respective contribution from each of the emitters; and feeding back to all of the emitters at least a narrowband portion of the composite beam, the portion having a selected wavelength and containing a respective contribution from each of the emitters, wherein mutually coherent, phase-locked operation of the plurality of emitters is achieved such that each of the emitters lases at the selected wavelength with a phase difference that results in a coherent output beam that constructively combines the beams from each of the emitters such that the output beam has a brightness that is greater than the brightnesses of the individual emitters.

2. The method of claim 1, wherein mutually coherent operation of the plurality of emitters is achieved such that each of the emitters lases at a selected wavelength.

3. The method of claim 2, wherein mutually coherent operation of the plurality of emitters is achieved such that each of the emitters lases at the selected wavelength with a phase difference that results in the output beam having a brightness that is greater than the brightnesses of the individual emitters.

4. A method for producing mutually-coherent operation of a plurality of laser emitters, the method comprising:

receiving a respective emitted beam from each of the emitters, performing an optical Fourier transform on the emitted beams, and mixing the transformed beams in a focal plane of a lens;

positioning in the focal plane of the lens a diffractive, three-dimensional optical element that forms a composite beam that contains a respective contribution from each of the emitted beams, the diffractive optical element having a Bragg grating formed therein;

allowing the composite beam to pass through a path selector along a selected optical path; and causing at least a portion of the composite beam to be reflected back along the optical path through the path selector, such that the reflected portion is fed back through the diffractive optical element and the lens into the emitters in such a way that narrowband light from each of the emitters is fed back into all of the emitters, and wherein mutually coherent, phase-locked operation of the plurality of emitters is achieved such that each of the emitters lases at the same wavelength with a phase difference that results in a coherent output beam that constructively combines the beams from each of the emitters such that the output beam has a brightness that is greater than respective brightnesses of the individual emitters.

5. The method of claim 4, wherein the beams received from the emitters are mixed by overlapping the received beams in the focal plane of the lens.

6. The method of claim 4, wherein the optical element is a holographic optical element.

7. The method of claim 6, wherein the Bragg grating is recorded holographically in the optical element.

8. The method of claim 4, wherein each of the emitters outputs its respective beam from a respective front emitting aperture, the method further comprising positioning the optical element proximate the front-emitting apertures of the emitters.

9. The method of claim 8, further comprising positioning a collimating lens between the optical element and the front emitting apertures of the emitters.

10. The method of claim 8, further comprising forming a diffraction pattern on the front emitting apertures of the emitters, by reflection from the three-dimensional optical element, that repeats a spatial arrangement of the emitters.

* * * * *